United States Patent [19]

Esaki et al.

[11] Patent Number: 5,079,601
[45] Date of Patent: Jan. 7, 1992

[54] OPTOELECTRONIC DEVICES BASED ON INTRABAND TRANSITIONS IN COMBINATIONS OF TYPE I AND TYPE II TUNNEL JUNCTIONS

[75] Inventors: Leo Esaki, Katonah; Hideo Ohno, Ossining; Emilio E. Mendez, Croton-on-Hudson, all of N.Y.

[73] Assignee: International Business Machines Corporation, Armonk, N.Y.

[21] Appl. No.: 453,634

[22] Filed: Dec. 20, 1989

[51] Int. Cl.⁵ .................. H01L 27/12; H01L 45/00; H01L 29/161

[52] U.S. Cl. .................. 357/4; 357/16; 357/17; 357/30; 372/43; 372/45

[58] Field of Search .............. 357/4, 4 SL, 16, 17, 357/30 E, 30 B, 30 D, 61; 372/43, 44, 45

[56] References Cited

U.S. PATENT DOCUMENTS

| | | | |
|---|---|---|---|
| 4,679,061 | 7/1987 | Capasso et al. | 357/30 E |
| 4,730,207 | 3/1988 | Yamazaki | 357/17 |
| 4,743,951 | 5/1988 | Chang et al. | 357/16 |
| 4,760,430 | 7/1988 | Coon et al. | 357/16 |
| 4,760,579 | 7/1988 | Schulman et al. | 357/16 |
| 4,780,749 | 10/1988 | Schulman et al. | 357/16 |
| 4,806,993 | 2/1989 | Voisin et al. | 357/16 |
| 4,873,555 | 10/1989 | Coon et al. | 357/16 |
| 4,894,526 | 1/1990 | Bethea et al. | 357/30 E |
| 4,903,101 | 2/1990 | Maserjian | 357/30 E |
| 4,916,495 | 4/1990 | Awano | 357/4 |
| 4,918,496 | 4/1990 | Matsushima et al. | 357/16 |
| 4,933,728 | 6/1990 | Fukuzawa et al. | 357/17 |
| 4,941,025 | 7/1990 | Tabatabaie | 357/4 |

FOREIGN PATENT DOCUMENTS 1-106476  4/1989  Japan .................. 357/17

OTHER PUBLICATIONS

Shotov et al., "PbS/Pb.S.Se/Pb.Sn.Se . . . Active Region", Semiconductor Science Technology 5 (1990), 527–529.
Sweeney et al., "Resonant Interband Tunnel Diode", Appl. Phys. Lett. 54 (6), Feb. 6, 1989.
IBM Technical Disclosure Bulletin, "Negative Resistance Device", vol. 31, No. 7, Dec. 1988.
"Internsubband Emission from Semiconductor Superlattices Excited by Sequential Resonant Tunneling", by M. Helm et al., Physical Review letters, vol. 63(1) 1989.
"Novel infrared band-aligned superlattice laser" by Perng-Fei Yuh and K. L. Wang, Applied Physics Letter S1(18) 1983.
"Polytype Superlattices and Multi-Heterojunctions" by L. Esaki et al., Japanese Journal of Applied Physics 20(7) 1981.
"Electronic Devices Based in Tunneling Between Two-Dimensional Systems" by L. L. Chang and E. E. Mendez, IBM Technical Bulletin vol. 32, No. 3b, 1989.
"Theory and Applications of Band-Aligned Superlattices" by K. L. Wang and Perng-Fei Yuh, IEEE Journal of Quantum Electronics, vol. 25, No. 1, 1989.
"A Bird's-Eye View on the Evolution of Semiconductor Superlattices and Quantum Electronics", vol. QE-22, No. 9, 1986.
"A Perspective In Quantum Structure Development", by L. Esaki.

Primary Examiner—Rolf Hille
Assistant Examiner—Minhlcan Tran
Attorney, Agent, or Firm—Scully, Scott, Murphy & Presser

[57] ABSTRACT

The present invention is directed to novel optoelectronic devices, such as light emitters and detectors, that have a unique combination of semiconductor materials that provides a band arrangement resulting in improved efficiency of carrier injection. The devices are quantum well type devices in which discrete electronic states are formed by size quantization effects in the quantum well region. Electromagnetic radiation of emission and absorption occurs by the transition of electrons from a first energy state to a second energy state in either the conduction band or the valence band of the quantum well layer. The bands edges of the layers are offset such that under an appropriate bias, the discrete energy states reside in the bandgap of one of the electrodes and in an allowed region of the other electrode, with one state residing in the conduction band of one electrode and the other state residing in the valence band of the other electrode. The wavelength of the emitted or detected light is inversely proportional to the energy difference between the first and second states. Wavelength customization is facilitated by techniques for adjusting the energy difference.

42 Claims, 3 Drawing Sheets

OPTOELECTRONIC DEVICES BASED ON INTRABAND TRANSITIONS IN COMBINATIONS OF TYPE I AND TYPE II TUNNEL JUNCTIONS

This invention was made with government support under Contract No. DAAL03-86-C-0004, awarded by the Department of the Army. The government has certain rights in this invention.

BACKGROUND OF THE INVENTION

1. Field of the Invention

The present invention is directed to semiconductor optoelectronic devices and more particularly, to quantum well semiconductor optoelectronic devices having improved carrier injection efficiency and wavelength tuning.

2. Description of the Prior Art

Optoelectronic devices, such as lasers, light emitting diodes and light detectors, are useful in a wide range of applications, including communications systems, surgical instruments, and various electronic devices. Semiconductor optoelectronic devices are based upon the excitation and recombination of charge carriers in a semiconductor material. One such semiconductor optoelectronic device is a quantum well device, wherein a thin layer of semiconductor material, the quantum well active region, is sandwiched between layers of another semiconductor that serve as the sources of charge carriers that are injected into the quantum well. The cladding injection layers have a wider bandgap than the active layer and the quantum well layer is made very thin in order to form discrete energy levels in the active layer by the size quantization effect. In order to emit or absorb light, a quantum transition occurs between the conduction band and the valence band of the active region. Electrons are injected into the active region from one cladding layer and holes are injected into the active region from the other cladding layer. The electrons and holes recombine in the active region resulting in the emission of electromagnetic radiation.

There has been significant interest in developing techniques for improving the efficiency of such devices. The interest has focused on increasing the efficiency of carrier injection into the quantum well and recombination within the quantum well and also to providing wavelength tuning. In addition, it is also desirable to provide efficient device operation at wavelengths in the range of 1.3-10 um, currently of interest for optical communications.

One recent development in quantum well light-emitting technology being explored is resonant tunnelling in superlattice regions. In resonant tunnelling, minibands of the superlattice active region are aligned with energy levels in the cladding injector layers so that carriers tunnel through barrier layers from the injector layer to the collector layer at a single energy level. Helm et al., Physical Review Letters, Vol. 63(1) 1989, disclose sequential resonant tunnelling to provide intersubband emission from semiconductor superlattices. Yuh et al. in Appl. Phys. Lett. 51(18) 1987, disclose a band aligned superlattice laser in which an active region is formed with two minisubbands, the upper minisubband being aligned with the minisubband of the emitter region and the lower minisubband being aligned with the minisubband of the collector region While carrier injection is apparently improved, there is extreme dependence on the formation of the superlattice layers which must be very precise in order to provide the alignment of the manmade minibands.

SUMMARY OF THE INVENTION

The present invention is directed to semiconductor optoelectronic quantum well devices having a unique relationship of band energies of the semiconductor layers which provides a novel way of realizing efficient carrier injection and customization to a broad range of wavelengths. The devices are formed by a quantum well active region sandwiched between cladding electrode layers that are separated from the active region by thin tunnelling regions and/or by potential barriers. Thus, the devices may comprise three, four or five layers of semiconductor material. The quantum well active region contains at least two electronic states formed by the size-quantization effect. Under an operating bias voltage, each energy state resides in the forbidden region of one of the electrodes and simultaneously in the allowed region of the other electrode. One of the states resides in the conduction band of one electrode and the other state resides in the valence band of the other electrode.

The optoelectronic devices of the present invention are adaptable for electromagnetic energy emission or absorption. Thus, depending on the relationship of the band energies of the various materials used to form the layers, the resulting structures are capable of emitting or absorbing light from the near to the far infrared. In the active region, the energy states are spaced apart in either the conduction band or the valence band. The optical transitions, emission or absorption, take place between a pair of energy states. The difference in energy between the two states determines the frequency of the emitted or absorbed electromagnetic energy. If the optical transition takes place in the conduction band, the transition is between electron states. If the optical transition takes place in the valence band, the transition is between hole states.

For a light emitting device under bias, the higher electronic state resides in the conduction band of the emitter electrode and simultaneously resides in the bandgap of the collector electrode. The lower electronic state simultaneously resides in the bandgap of the emitter electrode and in the valence band of the collector electrode. To emit light, the structure is forward biased so that carriers are injected from the emitter electrode to the higher energy state in the active region. These carriers cannot travel directly to the collector electrode at that high energy level because the energy level resides in the bandgap of the collector layer. The carriers relax to the lower energy state thereby causing light to be emitted at a wavelength inversely proportional to the difference in energy of the two states. At the lower energy level, which lies in the valence band of the collector region, the carriers then travel through to the collector layer. The carriers are prevented from travelling back to the emitter electrode because the lower energy level resides in the bandgap of the emitter electrode.

For a light detecting device, the band edge arrangement is the same as the light emitter under an operating bias voltage. However, there is a difference in the material requirements in that in equilibrium, the Fermi level of the light-detecting device must be in the bandgap of either of the cladding electrodes. This difference in Fermi level alignment is necessary to allow a negative bias to be applied to the detector. Under an operating negative bias, the path for electrons is limited due to the energy band arrangement to being injected from the collector into the lower energy state in the quantum well. Absorption of light within the proper wavelength range will cause the electrons in the lower state to be excited to the higher energy level where they will flow to the emitter.

The devices may be implemented with a combination of type I and/or type II tunnel junctions that use more than two different materials, forming polytype heterostructures. In these embodiments, a thin tunnel barrier is provided between one or both of the cladding electrodes and the active region so that carriers are injected into the quantum well by tunnelling. In another embodiment, the devices are implemented with a combination of type I and/or type II heterojunctions in which carrier injection occurs through potential barriers at one or both of the electrode-active region interfaces.

The devices of the present invention operate in a more efficient manner than the minority-carrier injection of forward-biased pn junctions used in conventional semiconductor light-emitting devices and laser diodes, since there is no minority carriers involved in the operation of the inventive devices. In addition, the present invention differs drastically from the conventional resonant-tunnelling schemes. The present invention provides a system in which efficient carrier injection may be more easily realized and which also facilitates customization to a broad range of wavelengths. Various known techniques may be employed to vary the spacing between the energy states in the quantum well to provide the desired wavelength for light emission or absorption.

BRIEF DESCRIPTION OF THE DRAWINGS

FIG. 1a shows the equilibrium state and FIG. 1b shows the biased state.

FIG. 3a shows the equilibrium state and FIG. 3b shows the biased state.

DETAILED DESCRIPTION OF THE INVENTION

Figure 1A:
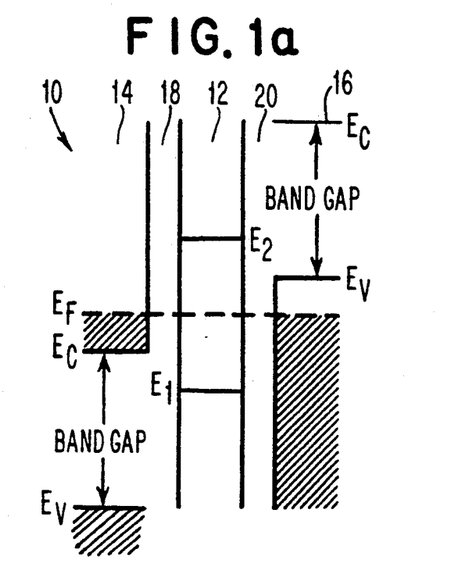
FIGS. 1a and 1b are examples of energy band profiles for the light emitting devices of the present invention.
Figure 1B:
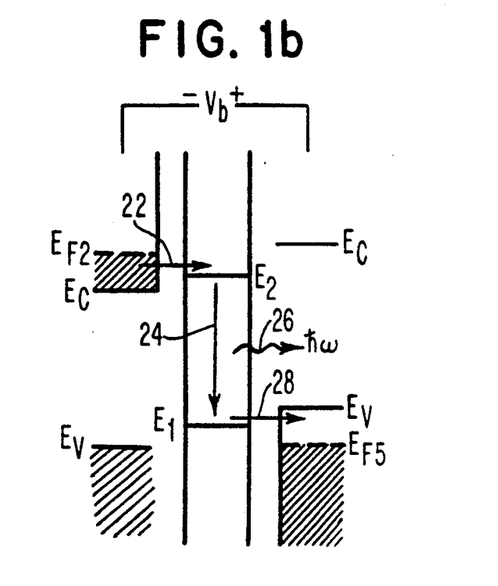
Figure 3A:
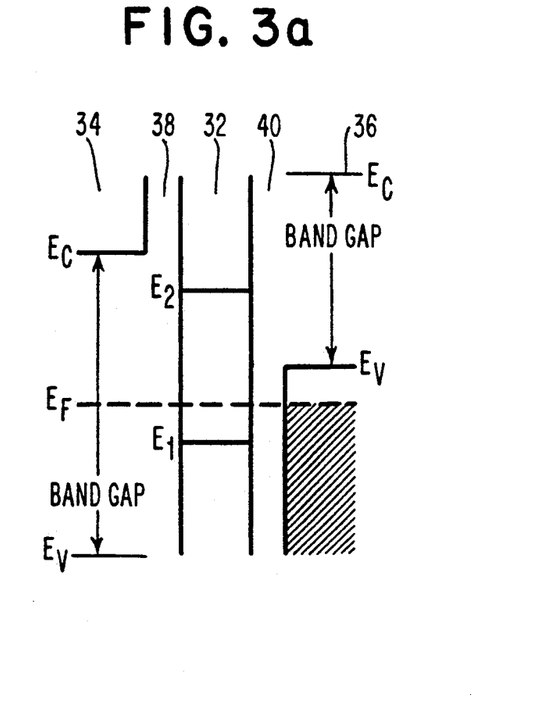
FIGS. 3a and 3b are examples of energy band profiles of the light detecting devices of the present invention.
Figure 3B:
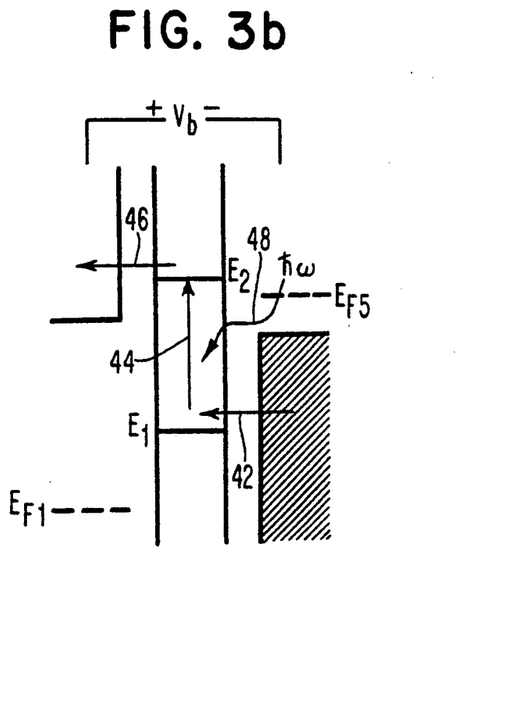

Referring now to the drawings, FIGS. 1a and 1b depict energy band profiles for the light emitting devices of the present invention. The profiles shown in FIGS. 1a and 1b, as well as in FIGS. 3a and 3b, are general in nature and are designed to portray the basic concept of the invention. The band edges for all of the layers are not shown, as only the area of interest for the structures is depicted. The band edges not shown may vary for particular material systems, but their general relationship with the shown edges will be described. In addition, all the figures depict five layer devices but it will be understood by those skilled in the art that the energy band profiles will be identical for three and four layer devices with the energy band for either one or both of the electrodes being shifted to be adjacent to the active region in the absence of a barrier layer.

Turning now to FIG. 1a, there is shown a five layers light emitting device 10 in equilibrium, comprised of a quantum well region 12 sandwiched between a first cladding electrode 14 and a second cladding electrode 16. Electrode 14 is separated from the quantum well region 12 by tunnel barrier 18 and electrode 16 is separated from the quantum well region 12 by tunnel barrier 20. In the quantum well region 12, a plurality of energy states are formed by the size-quantization effect. In order to provide the necessary carrier confinement to form the discrete energy levels, tunnel barriers 18 and 20 must have a wider bandgap than the bandgap of the active region 12. As shown in FIG. 1a, two energy states $E_1$ and $E_2$ are formed. It should be understood that the band edge of the active region 12 is not shown because the energy states $E_1$ and $E_2$ may be formed in either the conduction band or the valence band of layer 12. If the energy states are in the conduction band, the conduction band edge will be below $E_1$. Alternatively, if the energy states are in the valence band, the valence band edge will be above $E_2$.

Barrier layers 18 and 20 are tunnel barriers such that the bandgap must be wide enough so that the layers act like insulators and also thin enough so that carriers can tunnel through the layers. In the illustrative embodiment shown in FIG. 1a, in the equilibrium or unbiased condition, the light emitting device is formed with the energy state $E_1$ residing in the bandgap of electrode 14 and simultaneously in the valence band of electrode 16. Energy state $E_2$, resides simultaneously in the conduction band of electrode 14 and the bandgap of electrode 16. Alternative equilibrium band edge arrangements are also possible such as where both $E_1$ and $E_2$ resides only in allowed regions of the electrodes 14 and 16.

As shown in FIG. 1b, under an appropriate forward bias voltage $V_b$, i.e., electrode 16 biased positively with respect to electrode 14, the alignment of the bands is such that electrons will tunnel from the conduction band of layer 14 through layer 18 to energy state $E_2$. The electrons in state $E_2$ are prevented from tunnelling directly through to layer 16 because state $E_2$ resides in the bandgap of layer 16. Arrow 22 depicts the tunnelling of carriers from 14 to 12. In the quantum well 12, the electrons relax to state $E_1$ as depicted by arrow 24. The relaxation results in the emission of electromagnetic radiation depicted by arrow 26 of energy hw. The wavelength of the emitted light will be inversely proportional to the energy difference $E_2 - E_1$. The recombined electrons in state $E_1$ then tunnel through layer 20 to electrode layer 16 as depicted by arrow 28. This is the only path for the electrons leaving state $E_1$ since state $E_1$ resides in the bandgap of layer 14 preventing electrons from tunnelling back to 14. Thus, very efficient carrier injection and optical transitions are achieved with a device formed with the band alignments in accordance with the present invention.

Figure 2:
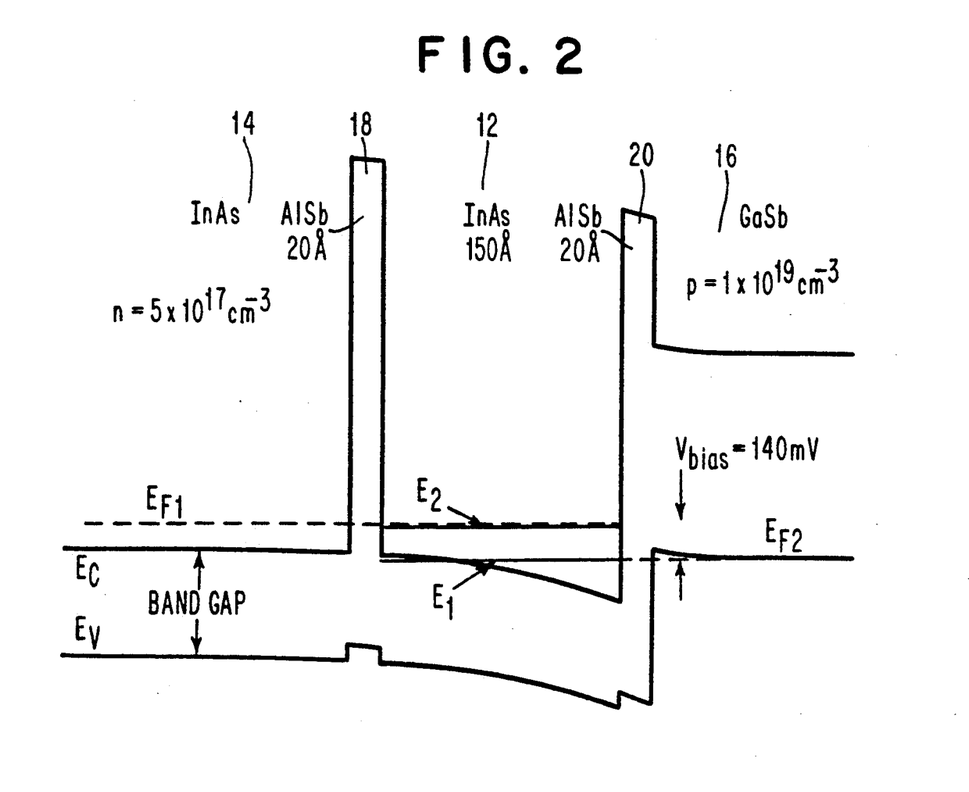
FIG. 2 is an energy band profile of a specific embodiment of the light emitting device of the present invention in a biased state.

In the illustrative embodiment shown in FIG. 2, the present invention is implemented with a combination of type I and type II tunnel junctions that use more than two different materials, forming polytype heterostructures. Polytype heterostructures were first disclosed by Esaki et al., Jp. J. of Appl. Phys. 20(7) 1981. A type I tunnel junction is such that under equilibrium the conduction band of the emitter is higher in energy than the valence band of the collector. In addition, a type I tunnel junction is formed with the conduction band of the collector higher in energy than the valence band of the emitter. In contrast, in type II tunnel junctions, the conduction band of the emitter is lower in energy than the valence band of the collector or alternatively the conduction band of the collector is lower in energy than the valence band of the emitter.

An example of a type I tunnel junction is InAs-AlSb-InAs. An example of a type II tunnel junction is InAs-AlSb-GaSb. Both of these tunnel junctions are crystal-lattice compatible and may be routinely prepared by modern deposition techniques such as molecular beam epitaxy. The integration of these two tunnel junctions and material structure is shown in FIG. 2. Electrode 14, tunnel barrier 18 and active region 12 are comprised of InAs-AlSb-InAs, respectively, a type I tunnel junction. At the same time, the quantum well region 12, barrier layer 20 and electrode 16 are comprised of InAs-AlSb-GaSb, respectively, a type II tunnel junction. Thus, the five layer light emitting device 10 is formed by a combination of the type I and type II tunnel junctions. As can be seen from the alignment of the conduction band $E_C$ and the valence band $E_V$ of each of the layers, the combination of type I and type II tunnel junctions allows for the realization of the conditions illustrated in FIG. 1b. It will be obvious to those skilled in the art that other material systems from which type I and type II tunnel junctions may be formed can be combined to provide the band edge arrangement of the present invention and the use of such other systems is contemplated herein.

FIG. 2 is a calculated band diagram under dc bias of 140 mV. Active layer 12 is shown as having a thickness of 150 angstroms and barrier layers 18 and 20 are shown as having a thickness of 20 angstroms each. It should be understood that these thicknesses are exemplary only. Layer 14 is n-doped and layer 16 is p-doped. As with the thicknesses, the doping concentration shown for layer 14 of $5 \times 10^{17}$ cm$^{-3}$ and the doping for layer 16 of $1 \times 10^{19}$ cm$^{-3}$ are also exemplary only. Under a bias voltage $V_b$ of 140 mV, and for energy difference of $E_2 - E_1$ equal to 0.12 eV, the corresponding light emission would be in the 10 um range. By proper selection of material combinations, that may include alloys of the above InAs, GaSb and AlSb or other semiconductors compatible with them, and of the layer thicknesses, the light emission can be extended to both lower and longer wavelengths. Thus, emission near 1.8 um can be achieved using a 50 angstrom InAs quantum well region 12 and AlGaAsSb as an injector layer 14 of carriers.

The preferred embodiment of the invention has been described above, however, several variations of the basic structure are possible. In one embodiment, a similar structure to that of FIG. 2 is provided but having GaSb as the active layer 12 instead of InAs. The material structure is n-InAs/AlSb/GaSb/AlSb/p-GaSb. In this embodiment, the optical transitions will take place between hole states in GaSb as the two energy states $E_1$ and $E_2$ are located within the valence band of the active region. Upon applying a bias to this device, holes are supplied to the active region 12 from the electrode 16 at the higher energy level $E_1$, the holes then relax to the lower energy state $E_2$ to radiate electromagnetic energy inversely proportional to the energy difference between states. The holes are then collected by electrode 14 at an energy level of $E_2$.

In another variation, the invention may be implemented in a 2, 3 or 4 layer structure in which at least one junction is a type II heterojunction or a type II tunnel junction. A type II heterojunction has the same band edge offset requirement described above for the type II tunnel junction, except without the tunnelling layer being present. For example, the elimination of the AlSb barrier layer 18 in the structure of FIG. 2, results in the optical transition occurring between quantum states in the accumulation layer formed at the interface of AlSb layer 20 and InAs layer 12. Likewise, the elimination of the AlSb barrier layer 20 in the structure of FIG. 2, results in the optical transition taking place at the InAs layer 12 GaSb layer 16 interface. The elimination of both AlSb barrier layers 18 and 20 in the structure of FIG. 2, will result in the optical transition occurring between quantum states in the accumulation layer formed at the interface of InAs layer 12 and GaSb layer 16. Where the tunnel layers are eliminated, carrier confinement is provided by a triangular potential barrier formed by band bending at the electrode and active region interface(s).

In another embodiment of the invention, tunnelling may be provided between the electrodes and the quantum well by the formation of zero thickness potential barriers. As shown by L. Chang and E. Mendez, IBM Tech. Bul. Vol. 32, No. 3B, August 1989, tunnelling may occur in two-dimensional systems by a zero thickness potential barrier between certain heterostructures. This concept is one method for realizing 3 and 4 layer devices of the invention.

A further embodiment includes the use of multilayer structures in layers 14 and 16 to manipulate and increase the refractive index of the cladding layers so that light guiding can be provided to the emitted radiation and e.g. low-threshold laser operation can be achieved. In addition, the use of short-period superlattices as electrodes layers 14 and 16 may be employed. In this system, the superlattices are designed in such a way that one of them has a mini-gap at the energy position of $E_2$ (see FIG. 1) and a mini-band at the energy position of $E_1$, whereas the other one has a mini-gap at $E_1$ and a mini-band at $E_2$.

Light detectors can be constructed utilizing the same basic principle. FIGS. 3a and 3b show band diagrams of a detector, FIG. 3a being without bias and FIG. 3b being in operation, i.e., with bias. As with the light emitting device of FIG. 1, the detector 30 shown in FIG. 3 is a five layer embodiment of the detector, with a quantum well region 32 separated by electrodes 34 and 36 and tunnel barriers 38 and 40. It should be noted that there is a difference in the material requirement from the light emitting structures of FIG. 1. For light detection, the Fermi level $E_F$ of the structure under equilibrium must be in the bandgap in either layer 34 or layer 36 to allow the application of a negative bias to the structure. Under a negative bias voltage, as shown in FIG. 3(b), state $E_1$ is in the valence band of electrode 36 and in the bandgap of electrode 34, while state $E_2$ is in the bandgap of electrode 36 and in the conduction band of layer 34.

The arrangement of the bands as shown in FIG. 3b under appropriate negative DC bias, provides for electrons in layer 36 to tunnel through layer 40 to state $E_1$ where they are excited to state $E_2$ by absorption of light of energy $E_2 - E_1$. The electrons then tunnel from state $E_2$ through layer 38 to layer 34. As in the case of the light emitting devices, the path available for electrons to reach electrode 34 is limited to the path depicted by arrows 42, 44 and 46, with absorption of photons with the proper energy depicted by arrow 48. This is due to the fact that state $E_1$ is in the bandgap of electrode 34 which prevents direct tunnelling from 36 to 34 and that energy state $E_2$ is in the bandgap of layer 36 preventing electrons from tunnelling back to 36. As can be seen, in the operating or biased state, both energy states $E_1$ and $E_2$ reside simultaneously in the bandgap of one electrode and in an allowed region of the other electrode.

Figure 4:
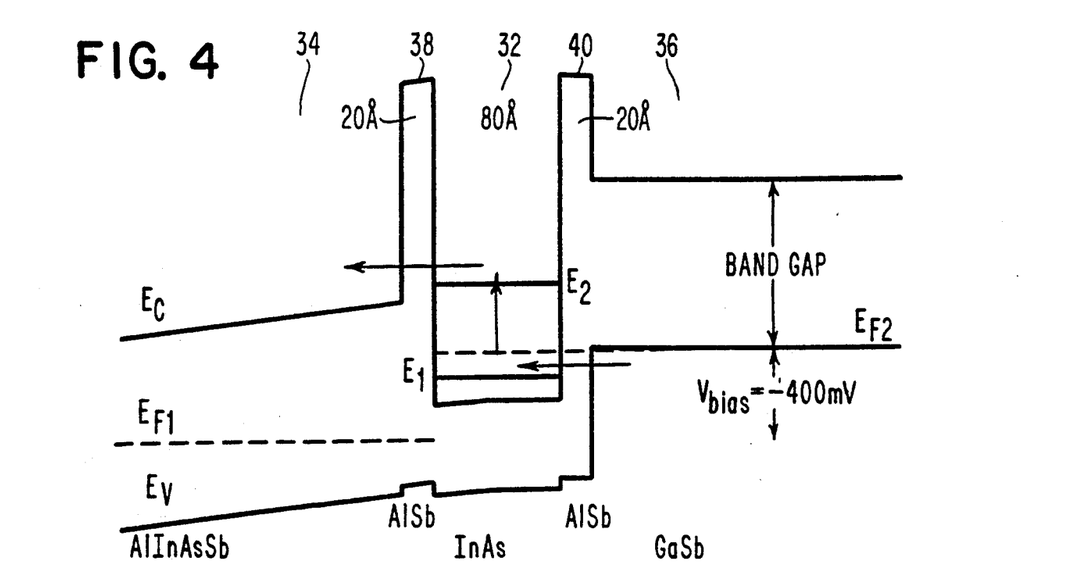
FIG. 4 is an energy band profile of a specific embodiment of the light detecting device of the present invention in a biased state.

The implementation of the invention for light detecting devices can also be made by a combination of type I and type II tunnel junctions In the illustrative embodiment shown in FIG. 4, the light detector 30 is formed by an AlInAsSb layer 34, an AlSb layer 38, an InAs layer 32, an AlSb layer 40 and a GaSb layer 36. As shown, the ground energy state $E_1$ lies in the bandgap of the AlInAsSb layer 34 and at the same time $E_2$ lies in the bandgap of the GaSb layer 36. Electrons are supplied from a GaSb layer 36 valence band to $E_1$ but are blocked by the bandgap of the AlInAsSb layer 34. As with the light emitter, other material systems are contemplated herein that will provide the band edge arrangement of the invention.

The energy band profile of FIG. 4 is the calculated bands for a quantum well 32 of 80 angstroms, tunnel barriers 38 and 40 of 20 angstroms and under an applied bias voltage of 400 mV. In this case $E_2 - E_1$ will be 0.345 eV, with a corresponding absorption wavelength of 3.59 um. Similar variations in structure as described with respect to the light emitting devices also apply to the light detecting devices. Thus, the detectors may be formed by 3 and 4 layer structures of various combinations of type I and type II heterojunctions and type I and type II tunnel junctions as described above.

Figure 5A:
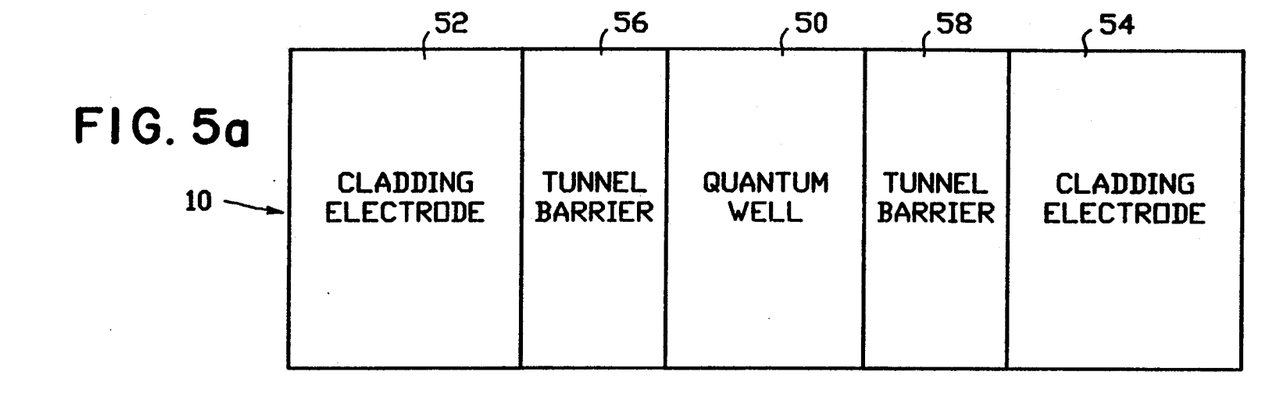
FIGS. 5a and 5b are schematic representations of two embodiments for the optoelectronic device of the present invention.
Figure 5B:
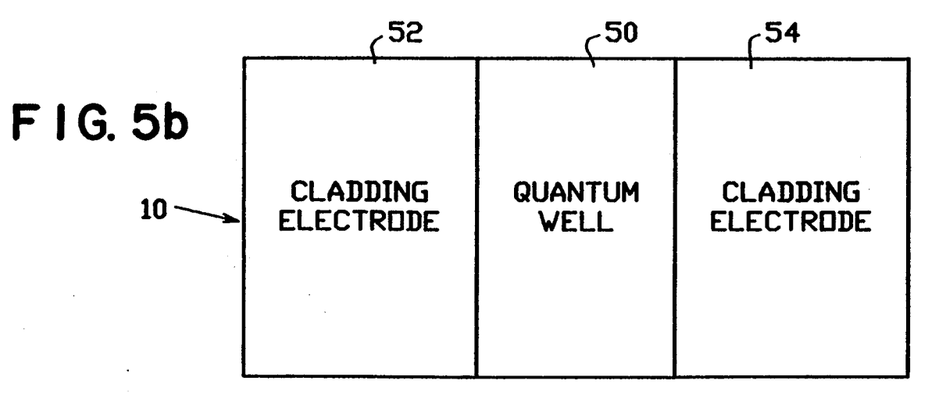

Referring now to FIGS. 5a and 5b, there is shown an embodiment for a five layer semiconductor optoelectronic quantum well device 10 and a three layer semiconductor optoelectronic quantum well device 10. FIG. 5a illustrates the basic structure of the device 10 as comprising a quantum well region 50 sandwiched between a first cladding electrode 52 and a second cladding electrode 54. The quantum well region 50 is separated from the cladding electrodes 52 and 54 by tunnel barrier regions 56 and 58. The structure illustrated in FIG. 5a can be implemented to emit light and thus comprise the semicondutor compounds depicted in FIG. 2 wherein the cladding electrodes 52 and 54 correspond to cladding electrodes 14 and 16, the quantum well region 50 corresponds to quantum well region 12 and tunnel barriers 54 and 56 correspond to tunnel barriers 18 and 20. The structure illustrated in FIG. 5a can also be implemented to absorb light and thus comprise the semiconductor compounds depicted in FIG. 4 wherein the cladding electrodes 52 and 54 correspond to cladding electrodes 34 and 36, the quantum well region 50 corresponds to quantum well region 32 and tunnel barriers 54 and 46 correspond to tunnel barriers 38 and 40. The semiconductor compound arrangement can also be varied in a similar manner for the three layer device depicted in FIG. 5b.

The optoelectronic quantum well device can be simply manufactured by any known process for creating semiconductor devices such as the growth of epitaxial layers on a substrate. One of the most popular and versatile techniques for growing epitaxial layers is molecular beam epitaxy or MBE. Another viable technique which can be utilized is metal organic chemical vapor deposition. The particular technique one chooses depends on a variety of circumstances including the availability of the particular instruments needed to implement the particular technique.

In accordance with the present invention, the optical transitions occur between discrete energy states in one of the allowed bands of the quantum well rather than between bands. The utilization of the energy states in this manner, together with the unique band alignment of the layers, allows for a much improved carrier injection efficiency. In addition, the wavelength of emission and absorption can be easily customized by selecting material systems and thicknesses to create the discrete energy levels necessary to provide the desired wavelength.

Furthermore, the opto-electronic devices of the invention can be made tunable to different wavelengths by the application of a moderate magnetic field perpendicular to the interfaces of the structures. A magnetic field allows for device tunability by permitting light emission or absorption between two magnetic levels (Landau levels). In addition, the presence of the magnetic field creates singularities in the density of the electronic states, which will enhance the efficiency of the device.

Analogous performance enhancement may be gained by further reduction of dimensionality of the electronic states in the well from two to one or zero dimensions, which would lead to singularities in the density of states. Such a reduction in dimensionality can be achieved by conventional lithographic techniques to produce quantum wires or quantum dots.

Although the implementation of the concepts of invention imposes certain limitations as to the materials systems that can be employed, the use of externally-produced stress or strained-layer heterostructures can expand the range of suitable materials. Finally, the inclusion of a third electrical terminal in the active region of the devices would provide an additional degree of freedom and will contribute to the optimization of device performance.

While the invention has been particularly shown and described with respect to the preferred embodiments thereof, it should be understood by those skilled in the art that the foregoing and other changes in form and details may be made therein without departing from the spirit and scope of the invention which should be limited only by the scope of the appended claims.

Having thus described the invention, what is claimed as new, and is desired to be secured by Letters Patent is:

1. An optoelectronic device comprising:
   a first region of semiconductor material having conduction and valence allowed energy bands defined by corresponding band edges spaced apart by an energy bandgap;
   a second region of semiconductor material having conduction and valence energy bands defined by corresponding band edges spaced apart by an energy bandgap; and
   a quantum well active region of semiconductor material sandwiched between said first and second regions, said quantum well region having at least two energy states, under a bias voltage at least a first of said energy states residing within the bandgap of one of said first and second regions and simultaneously residing within one of said allowed energy bands of the other of said first and second regions.

2. The optoelectronic device of claim 1 wherein, under said bias voltage at least a second of said energy states resides within the bandgap of one of said first and second regions and simultaneously resides within one of the allowed energy bands of the other of said first and second regions.

3. The optoelectronic device of claim 2 wherein one of said first and second energy states resides in conduction band of one of said first and second regions and the other of said first and second energy states resides in the valence band of the other of said first and second regions.

4. The optoelectronic device of claim 3 wherein said active region and at least one of said first region and said second region form a type II heterojunction.

5. The optoelectronic device of claim 3 wherein said first region is InAs, said second region is GaSb and said active region is one of InAs and GaSb.

6. The optoelectronic device of claim 2 or 3 further including means for applying a bias to said device sufficient to cause one of emission and absorption of electromagnetic energy between said first and second energy states in said quantum well region.

7. The optoelectronic device of claim 2 further including a first tunnel barrier disposed between said first region and said quantum well region and a second tunnel barrier disposed between said second region and said quantum well region.

8. The optoelectronic device of claim 7 wherein said first and second tunnel barriers are each comprised of a layer of semiconductor material having a bandgap wider than the bandgap of said quantum well region to provide carrier confinement and to act as an insulator, said first and second barriers being sufficiently thin to permit carrier tunnelling.

9. The optoelectronic device of claim 7 wherein said first region, said first tunnel barrier and said quantum well region form a type I tunnel junction and wherein said quantum well region, said second tunnel barrier and said second region form a type II tunnel junction.

10. The optoelectronic device of claim 9 wherein said first region, said first barrier layer, said active region, said second barrier layer and said second region are InAs/AlSb/InAs/AlSb/GaSb, respectively.

11. The optoelectronic device of claim 7 wherein said first region, said first barrier layer and said active region form a type II tunnel junction and wherein said active region, said second barrier layer and said second region form a type I tunnel junction.

12. The optoelectronic device of claim 11 wherein said first region, said first barrier layer, said active region, said second barrier layer and said second region are InAs/AlSb/GaSb/AlSb/GaSb, respectively.

13. The optoelectronic device of claim 7 wherein under equilibrium, the Fermi level resides in the bandgap of one of said first and second regions.

14. The optoelectronic device of claim 13 wherein said first region, said first barrier layer, said active region, said second barrier layer and said second region are AlInAsSb/AlSb/InAs/AlSb/GaSb, respectively.

15. The optoelectronic device of claim 13 wherein said first region, said first barrier layer, said active region, said second barrier layer and said second region are AlInAsSb/AlSb/GaSb/AlSb/GaSb.

16. The optoelectronic device of claim 2 further including a tunnel barrier disposed between said first region and said quantum well region.

17. The optoelectronic device of claim 16 wherein said tunnel barrier is comprised of a layer of semiconductor material having a bandgap wider than the bandgap of said quantum well region to provide carrier confinement and to act as an insulator, said tunnel barrier being sufficiently thin to permit carrier tunnelling.

18. The optoelectronic device of claim 16 wherein said first region, said barrier layer and said active region form one of a type I and a type II tunnel junction.

19. The optoelectronic device of claim 18 wherein said first region, said barrier layer, said active region and said second region are one of InAs/AlSb/InAs/GaSb, respectively and InAs/AlSb/GaSb/GaSb, respectively.

20. The optoelectronic device of claim 16 wherein under equilibrium, the Fermi level resides in the bandgap of one of said first and second regions.

21. The optoelectronic device of claim 20 wherein said first region, said barrier layer, said active region and said second region are one of AlInAsSb/AlSb/InAs/GaSb, respectively and AlInAsSb/AlSb/GaSb/GaSb, respectively.

22. The optoelectronic device of claim 2 further including a tunnel barrier disposed between said second region and said quantum well region.

23. The optoelectronic device of claim 22 wherein said tunnel barrier is comprised of a layer of semiconductor material having a bandgap wider than the bandgap of said quantum well region to provide carrier confinement and to act as an insulator, said tunnel barrier being sufficiently thin to permit carrier tunnelling.

24. The optoelectronic device of claims 2, 7, 16 or 22 wherein said at least two energy states are located within one of the conduction band and the valence band of said quantum well region.

25. The optoelectronic device of claims 7, 16 or 22 wherein each of said tunnel barriers is formed by a zero thickness potential barrier.

26. The optoelectronic device of claims 2, 7, 16 or 22 wherein said first and second energy states are located within the conduction band of said active region, said device further including means for applying a bias to said device such that electrons are supplied to said active region from said first region at an energy level of about that of the higher of said first and second energy states, said electrons relaxing to the lower of said energy states thereby radiating electromagnetic energy inversely proportional to an energy of about the difference between the higher and lower energy states, said electrons being collected by said second region at an energy level of about the lower of said energy states.

27. The semiconductor light-emitting device of claims 2, 7, 16 or 22 wherein said first and second energy states are located within the valence band of said active region, said device further including means for applying a bias to said device such that holes are supplied to said active region from said first region at an energy level of about that of the higher of said first and second energy states, said holes relaxing to the lower of said energy states thereby radiating electromagnetic energy inversely proportional to an energy of about the difference between the higher and lower energy states, said holes being collected by said second region at an energy level of about the lower of said energy states.

28. The optoelectronic device of claim 22 wherein said active region, said barrier layer and said second region form one of a type I and a type II tunnel junction.

29. The optoelectronic device of claim 28 wherein said first region, said active region, said barrier layer and said second region are one of InAs/InAs/AlSb- /GaSb, respectively and InAs/GaSb/AlSb/GaSb, respectively.

30. The optoelectronic device of claim 22 wherein under equilibrium, the Fermi level resides in the bandgap of one of said first and second region.

31. The optoelectronic device of claim 30 where said first region, said active region, said barrier layer and said second region are one of AlInAsSb/InAs/AlSb/GaSb, respectively and AlInAsSb/GaSb/AlSb/GaSb, respectively.

32. The optoelectronic device of claim 2 wherein under equilibrium, the Fermi level resides in the band gap of one of said first and second regions.

33. The optoelectronic device of claim 32 wherein said first region is AlInAsSb, said second region and said active region is one of InAs and GaSb.

34. The semiconductor light-detecting device of claims 32, 20, 30 or 13 wherein said first and second energy states are located within the conduction band of said active region, said device further including means for applying a reverse bias to said device such that electrons are supplied to said active region from said second region at an energy level of about that of the lower of said first and second energy states, said electrons being excited to the higher of said energy states by an absorption of electromagnetic energy inversely proportional to an energy of about the difference between the higher and lower energy states, said electrons being collected by said first region an energy level of about the higher of said energy states.

35. The semiconductor light-detecting device of claims 32, 20, 30 or 13 wherein said first and second energy states are located within the valence band of said active region, said device further including means for applying a reverse bias to said device such that holes are supplied to said active region from said second region at an energy level of about that of the lower of said first and second energy states, said holes being excited to the higher of said energy states by an absorption of electromagnetic energy inversely proportional to an energy of about the difference between the higher and lower energy states, said holes being collected by said first region at an energy level of about the higher of said energy states.

36. An optoelectronic device comprising:
a first region of semiconductor material having conduction and valence allowed energy bands defined by corresponding band edges spaced apart by an energy bandgap;
a second region of semiconductor material having conduction and valence energy bands defined by corresponding band edges spaced apart by an energy bandgap;
a quantum well active region of semiconductor material sandwiched between said first and second regions, said quantum well region having at least two energy states; and
a first tunnel barrier region disposed between said first region and said quantum well region, said first region, said first tunnel barrier and said quantum well region forming a type I tunnel junction; and
a second tunnel barrier region disposed between said second region and said quantum well region, said quantum well region, said second tunnel barrier and said second region forming a type II tunnel junction.

37. An optoelectronic device comprising:
a first region of semiconductor material having conduction and valence allowed energy bands defined by corresponding band edges spaced apart by an energy bandgap;
a second region of semiconductor material having conduction and valence energy bands defined by corresponding band edges spaced apart by an energy bandgap;
a quantum well active region of semiconductor material sandwiched between said first and second regions, said quantum well region having at least two energy states; and
a tunnel barrier disposed said first region and said active region, said first region, said tunnel barrier and said active region forming a type I tunnel junction and said active region and said second region forming a type II heterojunction.

38. An optoelectronic device comprising:
a first region of semiconductor material having conduction and valence allowed energy bands defined by corresponding band edges spaced apart by an energy bandgap;
a second region of semiconductor material having conduction and valence energy bands defined by corresponding band edges spaced apart by an energy bandgap;
a quantum well active region of semiconductor material sandwiched between said first and second regions, said quantum well region having at least two energy states; and
a tunnel barrier disposed between said first region and said active region, said first region, said tunnel barrier and said active region forming a type II tunnel junction.

39. An optoelectronic device comprising:
a first region of semiconductor material having conduction and valence allowed energy bands defined by corresponding band edges spaced apart by an energy bandgap;
a second region of semiconductor material having conduction and valence energy bands defined by corresponding band edges spaced apart by an energy bandgap;
a quantum well active region of semiconductor material sandwiched between said first and second regions, said quantum well region having at least two energy states; and
a tunnel barrier disposed between said second region and said active region, said first region and said active region forming a type II heterojunction and said active region, said tunnel barrier and said second region forming a type I tunnel junction.

40. An optoelectronic device comprising:
a first region of semiconductor material having conduction and valence allowed energy bands defined by corresponding band edges spaced apart by an energy bandgap;
a second region of semiconductor material having conduction and valence energy bands defined by corresponding band edges spaced apart by an energy bandgap;
a quantum well active region of semiconductor material sandwiched between said first and second regions, said quantum well region having at least two energy states; and
a tunnel barrier disposed between said second region and said active region, said active region, said tunnel barrier and said second region forming a type II tunnel junction.

41. The optoelectronic device of claims 37, 38, 39 or 40 further including means for applying a bias voltage to said first and second regions, such that a first of said energy states resides within the bandgap of one of said first and second regions and simultaneously resides within one of said allowed energy bands of the other of said first and second regions, and a second of said energy states resides within the bandgap of one of said first and second regions and simultaneously resides within one of the allowed energy bands of the other of said first and second regions with the first energy state residing in the conduction band of one of the first and second regions and the second energy state residing in the valence band of the other of the first and second regions, said bias voltage causing one of emission and absorption of electromagnetic energy between said first and second energy states in said quantum well region.

42. An optoelectronic device comprising:

a first region of semiconductor material having conduction and valence allowed energy bands defined by corresponding band edges spaced apart by an energy bandgap;

a second region of semiconductor material having conduction and valence energy bands defined by corresponding band edges spaced apart by an energy bandgap;

a quantum well active region of semiconductor material sandwiched between said first and second regions, said quantum well region having at least two energy states; and a first tunnel barrier region disposed between said firs region and said quantum well region, said first region, said first tunnel barrier and said quantum well region forming a type II tunnel junction; and a second tunnel barrier region disposed between said second region and said quantum well region, said quantum well region, said second tunnel barrier and said second region forming a type I tunnel junction.

* * * * *